(12) United States Patent
Wang et al.

(10) Patent No.: US 10,141,449 B2
(45) Date of Patent: Nov. 27, 2018

(54) OXIDE THIN FILM TRANSISTOR, ARRAY SUBSTRATE AND DISPLAY DEVICE

(71) Applicant: BOE TECHNOLOGY GROUP CO., LTD., Beijing (CN)

(72) Inventors: Meili Wang, Beijing (CN); Hongda Sun, Beijing (CN); Fengjuan Liu, Beijing (CN); Lungpao Hsin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/037,610

(22) PCT Filed: Sep. 15, 2015

(86) PCT No.: PCT/CN2015/089633
§ 371 (c)(1),
(2) Date: May 18, 2016

(87) PCT Pub. No.: WO2016/176946
PCT Pub. Date: Nov. 10, 2016

(65) Prior Publication Data
US 2017/0117416 A1 Apr. 27, 2017

(30) Foreign Application Priority Data
May 7, 2015 (CN) .......................... 2015 1 0229537

(51) Int. Cl.
*H01L 29/786* (2006.01)
*H01L 29/10* (2006.01)
(Continued)

(52) U.S. Cl.
CPC .......... *H01L 29/7869* (2013.01); *H01L 29/10* (2013.01); *H01L 29/1054* (2013.01);
(Continued)

(58) Field of Classification Search
CPC . H01L 29/1054; H01L 29/225; H01L 29/227; H01L 29/24; H01L 29/7869
See application file for complete search history.

(56) References Cited

U.S. PATENT DOCUMENTS

| | | | |
|---|---|---|---|
| 2007/0111033 A1* | 5/2007 | Ohashi | ................. H01L 29/225 |
| | | | 428/701 |
| 2009/0180045 A1 | 7/2009 | Yoon et al. | |

(Continued)

FOREIGN PATENT DOCUMENTS

| | | |
|---|---|---|
| CN | 101487961 A | 7/2009 |
| CN | 101752428 A | 6/2010 |

(Continued)

OTHER PUBLICATIONS

Written Opinion of the International Searching Authority from corresponding PCT Application No. PCT/CN2015/089633, dated Feb. 14, 2016 (4 pages).

(Continued)

*Primary Examiner* — Allan R Wilson
(74) *Attorney, Agent, or Firm* — Harness, Dickey & Pierce, P.L.C.

(57) ABSTRACT

The embodiments of the present invention provides an oxide TFT, an array substrate and a display device, an oxide channel layer of the oxide TFT comprises a front channel oxide layer and a back channel oxide layer, a conduction band bottom of the back channel oxide layer being higher than a conduction band bottom of the front channel oxide layer, and a band gap of the back channel oxide layer being larger than a band gap of the front channel oxide layer. In the oxide TFT, the array substrate and the display device provided in the present invention, it is possible to accumulate a large number of electrons through the potential difference formed between oxide channel layers of a multilayer structure so as to increase the carrier concentration in the oxide (Continued)

channel layers to achieve the purpose of improving TFT mobility without damaging TFT stability.

8 Claims, 2 Drawing Sheets

(51) Int. Cl.
    *H01L 29/225*     (2006.01)
    *H01L 29/227*     (2006.01)
    *H01L 29/24*     (2006.01)
    *H01L 27/12*     (2006.01)

(52) U.S. Cl.
    CPC .......... *H01L 29/225* (2013.01); *H01L 29/227* (2013.01); *H01L 29/24* (2013.01); *H01L 29/78696* (2013.01); *H01L 27/1225* (2013.01)

(56) References Cited

U.S. PATENT DOCUMENTS

| | | | |
|---|---|---|---|
| 2010/0148169 A1 | 6/2010 | Kim et al. | |
| 2010/0148170 A1 | 6/2010 | Ueda et al. | |
| 2011/0309411 A1* | 12/2011 | Takemura | H01L 29/7869 257/192 |
| 2012/0138922 A1* | 6/2012 | Yamazaki | H01L 29/7869 257/43 |
| 2013/0009219 A1* | 1/2013 | Yamazaki | H01L 29/7869 257/288 |
| 2013/0299819 A1* | 11/2013 | Yamazaki | H01L 29/7869 257/43 |
| 2013/0320334 A1 | 12/2013 | Yamazaki et al. | |
| 2014/0001465 A1* | 1/2014 | Yamazaki | H01L 29/66969 257/43 |
| 2014/0014947 A1* | 1/2014 | Yamazaki | H01L 29/7869 257/43 |
| 2014/0374745 A1* | 12/2014 | Takahashi | H01L 27/14663 257/43 |
| 2015/0021596 A1* | 1/2015 | Yamazaki | H01L 29/78693 257/43 |
| 2015/0187956 A1* | 7/2015 | Ahmed | H01L 29/78609 257/43 |
| 2017/0062482 A1* | 3/2017 | Yamazaki | H01L 29/7869 |

FOREIGN PATENT DOCUMENTS

| | | |
|---|---|---|
| CN | 101985741 A | 3/2011 |
| CN | 102122673 A | 7/2011 |
| CN | 102934232 A | 2/2013 |
| CN | 103985639 A | 8/2014 |
| CN | 104319293 A | 1/2015 |
| CN | 104538457 A | 4/2015 |
| WO | WO-2011/158888 A1 | 12/2011 |

OTHER PUBLICATIONS

Office Action from corresponding Chinese Application No. 201510229537.X, dated Jun. 21, 2017 (7 pages).

Office Action from Chinese Application No. 201510229537.X dated Feb. 9, 2018 (7 pages).

* cited by examiner

OXIDE THIN FILM TRANSISTOR, ARRAY SUBSTRATE AND DISPLAY DEVICE

TECHNICAL FIELD

The present disclosure relates to an oxide thin film transistor, an array substrate and a display device.

BACKGROUND

With the demand for high image resolution, high refresh rate and 3D technology development, the development of high mobility TFT material is crucial. Low temperature polycrystalline silicon may have mobility up to 100 cm$^2$/Vs, but its manufacturing cost is high and its uniformity still need to be further improved in the production of large-size backplanes. Oxide channel materials more studied currently comprise indium gallium zinc oxide (IGZO), indium tin zinc oxide (ITZO) and other materials with the mobility of 10~30 cm$^2$/Vs around, and need to be further improved in practical applications.

In the oxide TFT industry, the quantity of carriers in the channel is generally increased by doping metal ions in the oxide channel layer, to achieve the purpose of increasing TFT mobility. Wherein, the doping ions mostly are ions of large orbital radius with weak metal ion-oxygen bond energy, such as $In^{3+}$, $Sn^{4+}$, etc. However, because doping ions have weak bond energy with oxygen, they easily cause oxygen vacancies and oxygen dangling bonds, and finally affect the stability of oxide TFT.

SUMMARY

Embodiment of the present invention provides an oxide thin film transistor, an array substrate and a display device, to solve technical problems in the prior art, like poor stability and low mobility of oxide thin film transistors.

One aspect of the present invention provides an oxide thin film transistor, an oxide channel layer of which comprises a front channel oxide layer and a back channel oxide layer, a conduction band bottom of the back channel oxide layer being higher than a conduction band bottom of the front channel oxide layer, and a band gap of the back channel oxide layer being larger than a band gap of the front channel oxide layer.

Further, a material of the oxide channel layer is oxide or nitrogen oxide.

Further, a material of the back channel oxide layer is the same as material of the front channel oxide layer, the material of the back channel oxide layer having ion-doping, the material of the front channel oxide layer having no ion-doping or having ion-doping different from the material of the back channel oxide layer.

Further, the material of the back channel oxide layer is different from the material of the front channel oxide layer. Alternatively, the material of the back channel oxide layer and the material of the front channel oxide layer have ion-doping.

Further, the ion-doping are metal ion-doping.

Further, doping metal ions of the back channel oxide layer have work function less than that of the material of the front channel oxide layer.

Further, the ions are any of calcium, magnesium, sodium, potassium, lithium, indium, tin, hafnium, cesium, rubidium.

Further, the material of the back channel oxide layer is different from the material of the front channel oxide layer, and the material of the back channel oxide layer and the material of the front channel oxide layer do not have ion-doping.

Further, at least one of the material of the back channel oxide layer and the material of the front channel oxide layer is zinc oxide, indium gallium zinc oxide, indium tin zinc oxide or zirconium oxide.

In another aspect, the present invention further provides an array substrate, comprising the oxide thin film transistor as described above.

In yet another aspect, the present invention further provides a display device, comprising the array substrate as described above.

As can be seen, in the oxide thin film transistor, the array substrate and the display device provided in the present invention, it is possible to accumulate a large number of electrons through the potential difference formed between oxide channel layers of a multilayer structure so as to increase the carrier concentration in the oxide channel layers to achieve the purpose of improving TFT mobility without damaging TFT stability.

DRAWINGS

To more clearly illustrate the technical solution of an embodiment of the present invention or in the prior art, accompanying drawings to be used in the description of the embodiment or the prior art will be briefly described below. Apparently, the accompanying drawings in the following description are merely for some embodiments. From these drawings, those of ordinary skill in the art may also obtain other drawings without creative efforts.

DETAILED DESCRIPTION

To make the purpose, technical solution and advantages of embodiments of the present invention more clear, the technical solution in the embodiments of the present invention will be clearly and comprehensively described below in combination with the accompanying drawings. Obviously, the embodiments described are merely part of, instead of all, embodiments of the present invention. All other embodiments obtained by those of ordinary skill based on the embodiments of the present invention without creative efforts fall within the scope of protection of the present invention.

In the description of the present invention, it should be noted that orientation or position relations indicated by the terms "upper", "lower", "top", "bottom" are based on the drawings, only for facilitating in describing the present description and simplifying the description, rather than indicating or implying that the device or element indicated must have a specific orientation, be constructed and operate in particular orientation, and therefore can not be construed as limiting the present invention.

Furthermore, in the description of the present invention, unless otherwise specified, "a plurality of" means two or more.

Figure 1:
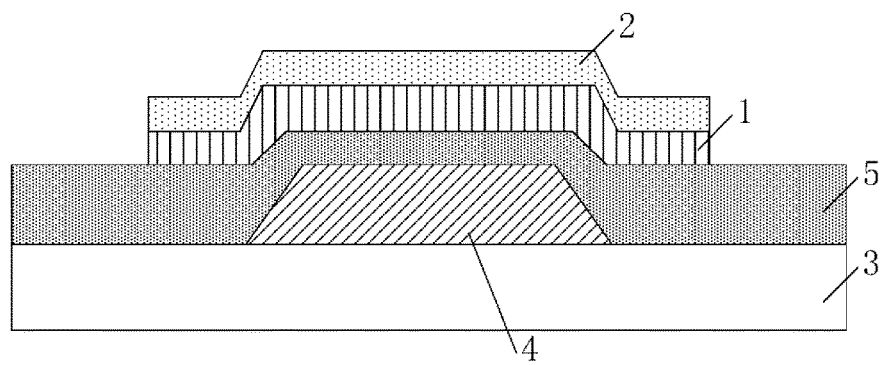
FIG. 1 is a schematic diagram of a structure of an oxide thin film transistor of an embodiment of the present invention.

The embodiment of the invention first provides an oxide thin film transistor as shown in FIG. 1, an oxide channel layer of the oxide thin film transistor comprises a front channel oxide layer 1 and a back channel oxide layer 2, a conduction band bottom of the back channel oxide layer 2 is higher than a conduction band bottom of the front channel oxide layer 1, and a band gap of the back channel oxide layer 2 is larger than a band gap of the front channel oxide layer 1. In addition, in FIG. 1, 3 indicates a substrate, 4 indicates a gate, 5 indicates a gate oxide layer.

Those skilled in the art should understand that for the range of energy an electron in a crystal can have, respective values of energy of the electron are usually represented visually by respective horizontal lines in physics. The greater the energy, the higher the position of the line, and many energy levels within a certain range of energies (each other closely spaced) form a band called energy band. Energy bands of various crystal are different in quantity and width. The energy range between two adjacent energy bands is called "energy gap" or "band gap". Work function, also known as escaping power, is minimum energy required for just moving an electron from inside the solid to the surface of the object. Valence band or called valence electric band, usually refers to the highest energy band that can be filled in by electrons at absolute zero degree in a semiconductor or insulator. Conduction band is energy space formed by free electrons, i.e., the range of energy that electrons freely moving within the solid structure have. Band gap refers to an energy band width (in units of electron volts (ev)). Energy of electrons in the solid does not have continuous values, but some discontinuous energy bands. There should be free electrons for conduction, whereby it can be seen that the energy band where free electrons are present is called a conduction band (electrically conductive). To become free electrons, bound electrons must obtain sufficient energy so as to transit to the conduction band, and the minimum value of this energy is band gap. After two different materials contact, since electrons have different potentials in different areas, band bending is formed, and the lower place of band bending is the place with more filled electrons, i.e., potential energy well. Since there is potential difference between conduction band levels of two channel materials, electrons of the back channel oxide transport toward the front channel at the interface between the back channel oxide and the front channel oxide, a potential energy well due to the band bending is formed at the interface and a large number of electrons are accumulated, thereby increasing the front channel carrier concentration, to achieve the purpose of increasing the TFT mobility.

Wherein, the material of the oxide channel layer may be an oxide or nitrogen oxide.

Alternatively, the material of the back channel oxide layer 2 may be the same as the material of the front channel oxide layer 1, and accordingly the material of the back channel oxide layer 2 has ion-doping while the material of the front channel oxide layer 1 may not have ion-doping or have ion-doping different than that of the material of the back channel oxide layer 1.

Alternatively, the material of the back channel oxide layer 2 may be different from the material of the front channel oxide layer 1. Alternatively, the material of the back channel oxide layer 2 and the material of the front channel oxide layer 1 may have or may not have ion-doping.

Wherein, the ion-doping may be metal ion-doping.

Alternatively, doping metal ions of the back channel oxide layer 2 may have work function less than that of the material of the front channel oxide layer 1.

Wherein, alternatively, the doping ion may be ions of metals like calcium, magnesium, sodium, potassium, lithium, indium, tin, hafnium, cesium and rubidium with low work function, or ions of other alloy with low work function or ions of other material, and the present invention is not limited to this. Ion doping concentration depends on actual needs.

Alternatively, at least one of the material of the back channel oxide layer 2 and the material of the front channel oxide layer 1 may be zinc oxide, indium gallium zinc oxide, indium tin zinc oxide or zirconium oxide.

Alternatively, the oxide thin film transistor may be of a bottom-gate structure, a top-gate structure or a coplanar structure.

Alternatively, the oxide thin film transistor may be of Etch Stop Type (ESL) or Back Channel Etch Type (BCE).

Embodiment 1

The embodiment 1 of the present invention provides an oxide thin film transistor which is a ZnO system TFT of a bottom-gate structure. Wherein the back channel oxide layer 2 is an ion doped ZnO system with a large band gap, and the front channel oxide layer 1 is an ion doped or non-ion doped ZnO system with a small band gap.

Wherein the front channel oxide layer 1 is deposited on a gate insulating layer 5, which is ZnO system material, and then the back channel oxide layer 2 formed by ZnO system material doped by ions with low work function is deposited, labeled as ZnO:M, wherein M represents a doping metal ion, and may be $Ca^{2+}$ or $Mg^{2+}$ and other metal ions with low work function. In the embodiment 1 of the present invention, for example metal ion $Ca^{2+}$ is used, the material is referred to as ZnO:Ca.

Figure 2:
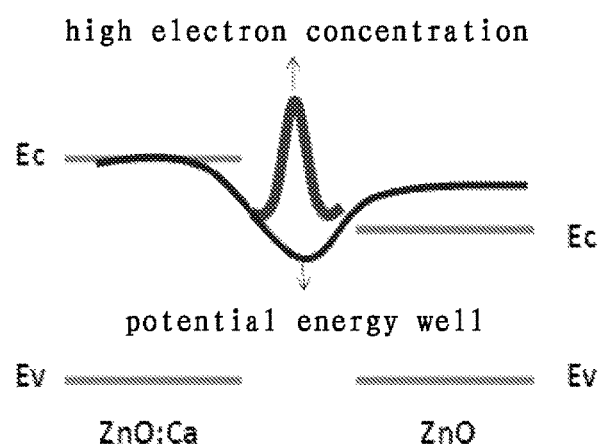
FIG. 2 is a schematic diagram of an interfacial potential energy well of an oxide channel layer of an oxide thin film transistor of embodiment 1 of the present invention.
Figure 3:
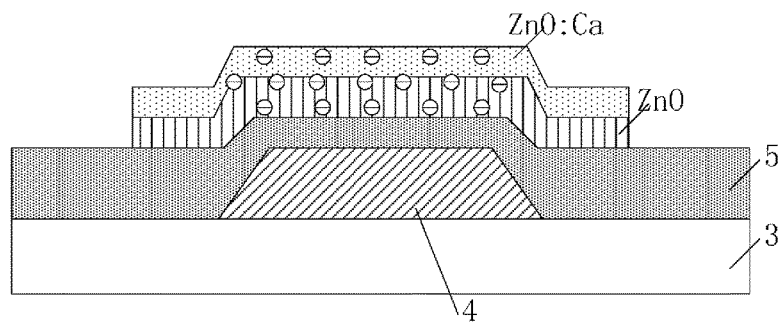
FIG. 3 is a schematic diagram of electron transport of an oxide channel layer of an oxide thin film transistor of embodiment 1 of the present invention.
Figure 4:
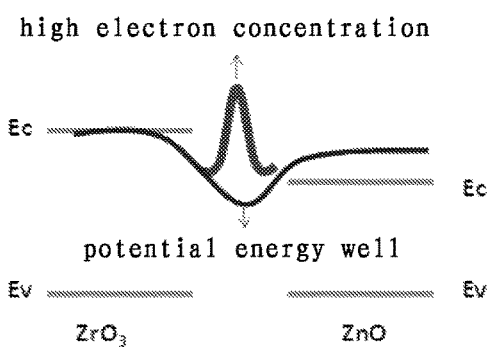
FIG. 4 is a schematic diagram of an interfacial potential energy well of an oxide channel layer of an oxide thin film transistor of embodiment 2 of the present invention.

The ZnO system material in the embodiment 1 may be ZnO or ion doped zinc oxide system material, such as: IGZO, ITZO and other material. Wherein, because the band gap (Eg) of calcium oxide CaO is 7.1 eV, and the band gap of ZnO system is ~3 eV, Eg (ZnO)<Eg (ZnO:Ca)<Eg (CaO). The conduction band level of ZnO:Ca of the back channel oxide layer 2 is higher than ZnO of the front channel oxide layer 1, and electrons flow from the ZnO:Ca conduction band of the back channel oxide layer 2 to the ZnO conduction band of the front channel oxide layer 1, thereby increasing the front channel carrier concentration. Furthermore, referring to FIG. 2, since the band bending will form a potential energy well at the ZnO:Ca/ZnO interface, and the concentration of electrons aggregated in the potential energy well is the highest, the interface potential energy well with the highest electron concentration becomes the main channel for electronic transportation, with reference to FIG. 3, and ultimately improves the mobility of the TFT device. It is noted that in FIGS. 2 and 4, Ec represents the conduction band bottom (the minimum energy electrons entering into the conduction band have), Ev represents the valence band top (the highest energy electrons in the valence band have), and the distance from Ev to Ec is the band gap.

Wherein the back channel oxide layer 2 is ZnO:M, and its doping metal ions need to have the work function less than the ZnO system of the front channel oxide layer 1, i.e., the conduction band bottom of the oxide doped with metal ions is higher than the conduction band bottom of the ZnO system, and the conduction band bottom of ZnO:M after ions are doped is higher than the conduction band bottom of the ZnO system so as to meet the conditions to form the ZnO:M/ZnO interface band bending and the potential energy well.

And, the ZnO system of the front channel oxide layer 1 may be ion doped or non-ion doped, which must meet characteristics that the band gap is less than the material of the back channel oxide layer 2 and that the conduction band bottom is lower than the conduction band bottom of the material of the back channel oxide layer 2.

In the present embodiment 1, the material of the back channel oxide layer 2 and the material of the front channel oxide layer 1 belong to the same system.

Embodiment 2

Figure 5:
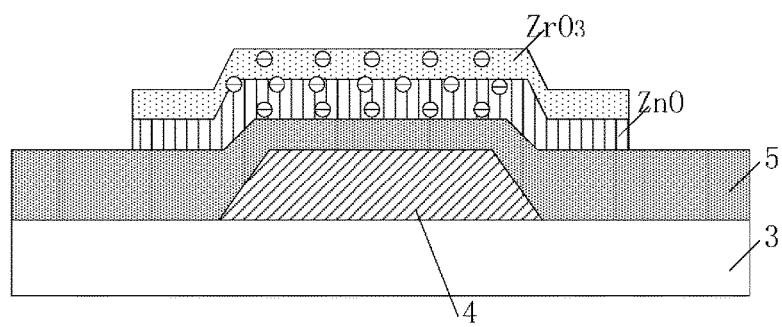
FIG. 5 is a schematic diagram of electron transport of an oxide channel layer of an oxide thin film transistor of embodiment 2 of the present invention.

The embodiment 2 of the invention provides an oxide thin film transistor, the back channel oxide layer 2 and the front channel oxide layer 1 have different material.

Wherein the front channel oxide layer 1 is deposited on the gate insulating layer 5, and on this layer ZnO system material with a small band gap and a low conduction band energy level is deposited, the band gap of the ZnO system being ~3 eV; then the $ZrO_3$ system material is deposited with a band gap of ~5.5 eV. Due to the conduction band energy level difference and the band gap difference between the ZnO and $ZrO_3$, electrons transport from $ZrO_3$ to ZnO and there is formed a potential energy well at the $ZrO_3$/ZnO interface, and referring to FIG. 4, the concentration of electrons aggregated in the potential energy well is the highest, while the interface potential energy well with the highest electron concentration becomes the main channel for electronic transportation, with reference to FIG. 5, ultimately improving the mobility of the TFT device.

Wherein, ZnO and $ZrO_3$ both may comprise or may not comprise ion doping.

Embodiment 3

The embodiment 3 of the invention provides an array substrate, comprising an oxide thin film transistor of at least one of the embodiments 1 to 2 of the above-described present invention.

Embodiment 4

The embodiment 4 of the invention provides a display device, comprising the array substrate of the embodiment 3 of the present invention. The display device may be a display panel, a display, a television, a mobile phone, a navigation system, e-book or tablet and any equipment or device having a display function.

As can be seen, in the oxide thin film transistor, the array substrate and the display device provided in the embodiments of the present invention, it is possible to accumulate a large number of electrons through the potential difference formed between oxide channel layers of a multilayer structure so as to increase the carrier concentration in the oxide channel layers to achieve the purpose of improving TFT mobility without damaging TFT stability.

Finally, it should be noted that the embodiments above-mentioned are merely to describe the technical solutions of the present invention, but not intended to limit the same. Although the present invention has been described in detail with reference to the embodiments aforementioned, those of ordinary skill should appreciate that they still can modify the technical solutions described in the foregoing various embodiments or replace equivalently some technical features thereof; while these modifications or replacements do not make the essence of the corresponding technical solutions depart from the spirit and scope of the technical solutions of the embodiments of the present invention.

This application claims priority to Chinese Patent Application No. 201510229537.X filed on May 7, 2015, the whole text of disclosure of which is incorporated by reference as part of this application.

The invention claimed is:

1. An oxide thin film transistor, comprising:
   a gate oxide layer; and
   an oxide channel layer comprising a front channel oxide layer and a back channel oxide layer, the front channel oxide layer located between the back channel oxide layer and the gate oxide layer and in contact with the gate oxide layer, a conduction band bottom of the back channel oxide layer higher than a conduction band bottom of the front channel oxide layer, and a band gap of the back channel oxide layer larger than a band gap of the front channel oxide layer;
   wherein a material of the back channel oxide layer is the same as a material of the front channel oxide layer, the material of the back channel oxide layer includes ion-doping, and the material of the front channel oxide layer includes no ion-doping or includes ion-doping different from that of the material of the back channel oxide layer.

2. The oxide thin film transistor according to claim 1, wherein the material of the oxide channel layers is oxide or nitrogen oxide.

3. The oxide thin film transistor according to claim 1, wherein the ion-doping includes metal ion-doping.

4. The oxide thin film transistor according to claim 3, wherein doping metal ions of the back channel oxide layer have a work function that is less than a work function of the material of the front channel oxide layer.

5. The oxide thin film transistor according to claim 1, wherein the doping ions include any one or more of calcium, magnesium, sodium, potassium, lithium, indium, tin, hafnium, cesium, and rubidium.

6. The oxide thin film transistor according to claim 1, wherein at least one of the material of the back channel oxide layer and the material of the front channel oxide layer is zinc oxide, indium gallium zinc oxide, indium tin zinc oxide or zirconium oxide.

7. An array substrate, comprising the oxide thin film transistor of claim 1.

8. A display device, comprising the array substrate of claim 7.

* * * * *